United States Patent [19]
Joist

[11] Patent Number: 5,587,888
[45] Date of Patent: Dec. 24, 1996

[54] EXTRACTING DEVICE FOR PLUG-IN MODULES

[75] Inventor: Michael Joist, Gaggenau, Germany

[73] Assignee: Schroff GmbH, Straubenhart, Germany

[21] Appl. No.: 584,358

[22] Filed: Jan. 11, 1996

[30] Foreign Application Priority Data

Jan. 23, 1995 [DE] Germany .......................... 195 01 898.2

[51] Int. Cl.$^6$ .................................................. H05K 7/14
[52] U.S. Cl. .............................. 361/802; 361/796; 439/64
[58] Field of Search .................................. 361/728, 752, 361/755, 756, 759, 796, 802; 439/327, 152, 347, 64; 312/320; 211/41

[56] References Cited

U.S. PATENT DOCUMENTS 4,699,594  10/1987  Assel et al. ............................... 439/152
4,725,921  2/1988   Scholz ...................................... 361/392

FOREIGN PATENT DOCUMENTS 0228235   7/1987   European Pat. Off. .
2221995   11/1972  Germany .
2823422   12/1978  Germany .
8607046.0 4/1986   Germany .
3739640   6/1989   Germany .

*Primary Examiner*—Leo P. Picard
*Assistant Examiner*—Y. Whang
*Attorney, Agent, or Firm*—Spencer & Frank

[57] ABSTRACT

An extracting device for plug-in modules having a holding bracket for securing a front plate as well as a printed circuit board to a profile rail of a module rack. A pivoted lever is articulated to a holding bracket; the pivoted lever rests with a pressing shoulder against a front face of the profile rail. To facilitate the extraction and to accomplish a large extraction lift, the pivoted lever is displaceable with respect to the holding bracket with the aid of a sliding mechanism which has a sliding pin on the holding bracket and a sliding track on the pivoted lever whose swing pin is displaceable in a slot of the holding bracket.

3 Claims, 1 Drawing Sheet

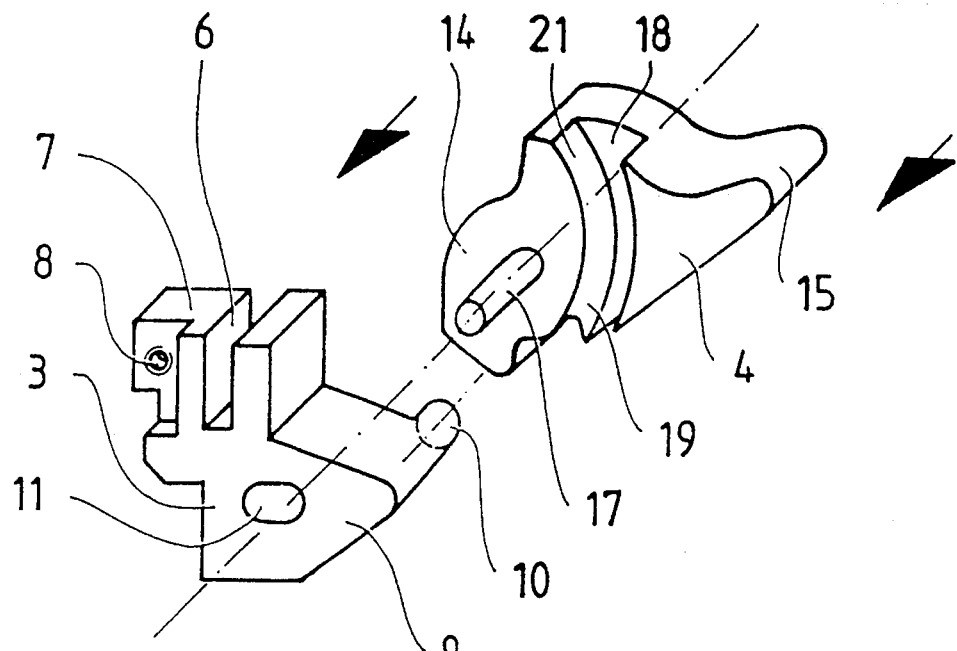
Fig. 1
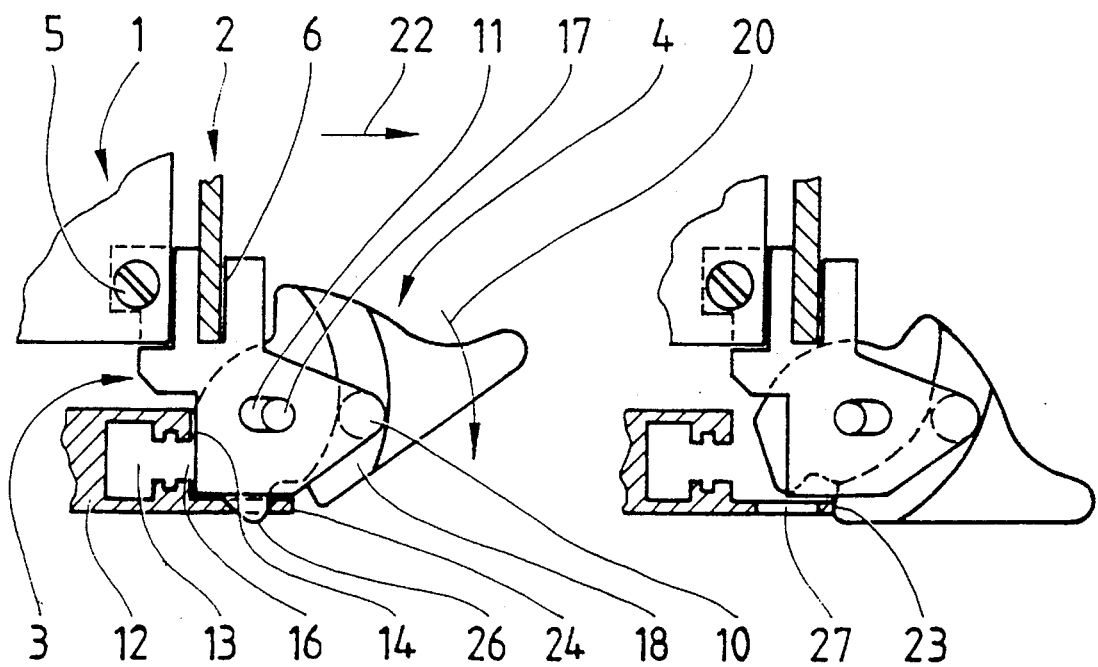
Fig. 2
Fig. 3

EXTRACTING DEVICE FOR PLUG-IN MODULES

CROSS-REFERENCE TO RELATED APPLICATION

This application claims the priority of Patent Application Serial No. 195 01 898.2 filed in Germany on Jan. 23, 1995, the subject matter of which is incorporated herein by reference.

BACKGROUND OF THE INVENTION

The invention relates to an extracting device for plug-in modules which are intended to be inserted into module racks, having a holding bracket for detachably securing a front plate as well as a printed circuit board on a profile rail of the module rack, having a pivoted lever which is seated on the holding bracket by means of at least one swing pin, and having a pressing shoulder on the pivoted lever, which shoulder is opposite of a front face of the profile rail when the plug-in module is inserted.

The invention is applied particularly for larger and densely assembled plug-in modules which, in the inserted position, are connected to the module rack and therewith to other electrical components through plug connectors.

The use of multipolar plug connectors arranged in three rows and being provided with up to 96 spring contacts results in high forces for inserting the plug-in modules and, in particular, for extracting them from the module racks. During extraction, a considerably greater force expenditure is required than during insertion because, initially, the high static friction forces between the microscopically rough blades and springs must be overcome.

In order to overcome the insertion and extraction forces, devices of many different designs having levers are known. These are intended to achieve the greatest possible leverage and, at the same time, a sufficiently wide displacement which is predetermined by the length of the blades of commercially available plug connectors. In designing these devices, internationally standardized dimensions and space requirements must be complied with which may not be exceeded, for example, with regard to the length of the lever arms. It is the object of the invention to design an extracting device with which the greatest possible leverage and thus low extraction forces can be achieved and, at the same, a large extraction lift can be attained, while requiring little space and being in compliance with the standards.

SUMMARY OF THE INVENTION

The above object is attained by starting from an extracting device for insertion into module racks, having a holding bracket for detachably securing a front plate as well as a printed circuit board on a profile rail of the module rack, having a pivoted lever which is seated on the holding bracket by means of at least one swing pin as well as having a pressing shoulder on the pivoted lever, which shoulder is opposite of a front face of the profile rail when the plug-in module is inserted. Such an extracting device is shown, for example, in Applicant's German utility model G 86 07 046.0.

The object is solved in that the pivoted lever is displaceable with respect to the holding bracket by way of a sliding mechanism. It turned out that, as is explained below, the problem can be solved by using a sliding mechanism in which the position of the swing axis of the pivoted lever is changed during the swinging of the lever.

It is advantageous if the swing pin disposed on the pivoted lever is displaceable in a slot of the holding bracket.

According to another feature of the invention, a sliding pin is arranged on the holding bracket as a sliding mechanism, while a sliding track for the sliding pin is provided on the pivoted lever.

In order to reduce the friction forces, the sliding pin may have a circular cylindrical configuration.

For constructive reasons, the sliding track is an open channel having a rectangular cross section.

The sliding track is arranged in such a manner that it has a concave curvature relative to the swing pin. Via the shaping of the curvature of the sliding track, the kinematics of the lift can be influenced as a function of the pivot angle of the pivoted lever.

BRIEF DESCRIPTION OF THE DRAWINGS

These and other features and advantages of the invention will be further understood from the following detailed description of the preferred embodiments with reference to the accompanying drawings in which:

FIG. 1 shows a holding bracket and an associated pivoted lever in a pulled-apart, perspective representation, enlarged to approximately double the scale;

FIG. 2 is a partial representation of a plug-in module which is inserted into a module rack, in a vertical section;

FIG. 3 the plug-in module according to FIG. 3 in the extracted position.

DETAILED DESCRIPTION OF THE PREFERRED EMBODIMENTS

The plug-in module which is partially illustrated in FIG. 2 substantially comprises a printed circuit board 1, a front plate 2, a holding bracket 3 and a pivoted lever 4.

The printed circuit board 1, illustrated as being broken off, is made of insulating material and has a grid of holes for the securing of electrical and electronic components which are in contact with one another by way of conductor tracks. In the region of its lower front corner, the printed circuit board 1 is screwed to the holding bracket 3 by means of a cap screw 5. At its rearward edge, the printed circuit board 1 supports the multipoint connector of a commercially available multipolar plug connector whose blade contact connector is secured to the module rack. The printed circuit board 1 is electrically connected to the other components of the module rack with the aid of this multipoint connector.

The front plate 2 is composed of aluminum sheet and is also shown as being broken off. It is an oblong-rectangular plate which is inserted with its lower narrow edge into a transverse slot 6 of the holding bracket 3 and is secured there.

The holding bracket 3 (see FIG. 1) is made of pressure die casting and has a rearward shoulder 7 with a threaded bore 8 for the cap screw 5. The transverse slot 6, which is cut deeply into the body of the holding bracket 3, receives the lower edge of the front plate 2 and supports fastening means for the front plate. The holding bracket 3 has a formed-on front console 9 having the shape of a three-edged prism at whose one front face projects a sliding pin 10 which has a circular cylindrical configuration. A slot 11 extends through the console 9.

It is the object of the holding bracket 3 to connect the front plate 2 with the printed circuit board 1 and to secure the plug-in module at a front profile rail 12 (see FIG. 2) of the module rack so as to be detachable. The securing is effected by means of a long thread screw extending through the holding bracket 3, which screw engages a threaded hole of a threaded strip which is inserted into a longitudinal groove 13 of the profile rail 12. A positioning pin which is provided at the holding bracket 3 and engages the longitudinal groove 13 facilitates the precise insertion of the plug-in module into the module rack. The elements which do not have reference numerals here are not illustrated in the Figures; these elements are part of the conventional configuration of commercially available plug-in modules and module racks.

At its short lever arm, the two-armed pivoted lever 4, which is made of synthetic material, is provided (FIG. 1) with a pressing shoulder 14. The long lever arm serves as an actuating handle 15 for extracting (and also for inserting) the plug-in module. In the inserted position of the plug-in module, the pressing shoulder 14 is opposite of a front face 16 of the profile rail 12 at a small distance, as can be seen in FIG. 2.

A cylindrical swing pin 17 projects laterally in transverse direction from the pivoted lever 4, which swing pin fits into the slot 11 of the holding bracket 3 and sits in the slot so as to be not only pivotable but also displaceable. Suitable fastening means are provided for holding the pivoted lever 4 on the holding bracket 3, for example, a cap screw which is screwed into a centered, threaded bore provided in the swing pin 17. Such holding may also be achieved by means of a plastic snap connection.

Furthermore, the pivoted lever 4 supports a sliding track 18. This sliding track 18 is an open channel having a rectangular cross section into which fits the sliding pin 10 of the holding bracket 3. The sliding track 18 has a concave curvature with respect to the swing pin 17; an initial region 19 of this sliding track 18 is disposed concentrically relative to the swing pin 17.

In a plug-in module which is inserted into the module rack—see FIG. 2—the pivoted lever 4 is in an upper position, the pressing shoulder 14 is opposite of the front face 16 of the profile rail 12 at a small distance, and the up to 100 and more plugs of the multipoint connector disposed on the printed circuit board 1 are plugged into the blades of the blade contact connector secured on the module rack. The swing pin 17 rests against the edge of slot 11 which is facing the console 9. By using the thread screw, which extends through the holding bracket 3, the plug-in module is secured to the module rack.

After loosening the thread screw which secures the holding bracket 3, the plug-in module can be extracted from the module rack. For this purpose, the actuating handle 15 is pushed down with one hand in the direction of arrow 20, which activates the sliding mechanism in that the sliding pin 10 slides forward in the sliding track 18. As long as the sliding pin 10 moves in the initial region 19, a displacement of the plug-in module is not effected; the swing pin 17 in the slot 11 of the holding bracket 3 also does not shift. This initial swinging of the pivoted lever 4 is used to actuate, for example, a microswitch. If the actuating handle 15 is then pushed down further, the pressing shoulder 14 comes to rest immediately against the front face 16 of the profile rail 12 and its inner sliding shoulder 21, which is adjacent to the swing pin 17, pulls the plug-in module frontward out of the module rack in the direction of arrow 22 via the sliding pin 10 of the holding frame 3. During this swinging movement of the pivoted lever 4, the swing pin 17 of the pivoted lever 4 shifts in the slot 11 of the holding bracket 3 in the direction of its pressing shoulder 14. During this swinging movement, the plugs of the plug connector are pulled out of the blades, for which purpose only a moderate force expenditure is needed because of the leverage of the pivoted lever 4. During this process, however, it is the extracting path achieved by the sliding mechanism which is of decisive importance; this path is greater, in any event, than the length of the plugs of the plug connector; the space requirements for the extracting device which are predetermined in standards are not exceeded in the process.

The end of the extracting process effected by means of the sliding mechanism is reached when the pressing shoulder 14 no longer finds support on the front face 16 of the profile rail 12. Then, a spur 23 provided at the pivoted lever 4 (FIG. 3) is activated which pushes itself against the front edge 24 of a front-side longitudinal strip 25 of the profile rail 12. FIG. 3 shows the plug-in module in the fully extracted position in which it can be taken out of the module rack.

A nose 26 which is provided on the pivoted lever 4 and disposed opposite of the spur 23 serves as a pull-in aid for the plug-in module, which nose engages a recess 27 in the longitudinal strip 25 of the profile rail 12 during the swinging of the pivoted lever 4 in the direction counter to arrow 20. The profile rail 12 supports a number of such recesses 27 which are arranged equidistantly. When the plug-in module is pulled in, the pivoted lever 4 is guided by the sliding mechanism, with the sliding mechanism working in the reverse direction.

It will be understood that the above description of the present invention is susceptible to various modifications, changes and adaptations, and the same are intended to be comprehended within the meaning and range of equivalents of the appended claims.

What is claimed is:

1. An extracting device for plug-in modules which are intended to be inserted into module racks, the device comprising a holding bracket for detachably securing a front plate as well as a printed circuit board on a profile rail of the module rack; a pivoted lever which is seated on the holding bracket by at least one swing pin, the latter being slidable in a slot of said holding bracket, said swing pin having a pressing shoulder on the pivoted lever, which shoulder is opposite of a front face of the profile rail when the plug-in module is inserted; said pivoted lever being displaceable with respect to the holding bracket by way of a sliding mechanism which comprises a sliding pin arranged on said holding bracket and a sliding track arranged on said pivoted lever, said sliding track having a concave curvature with respect to said swing pin.

2. An extracting device according to claim 1, wherein said sliding pin has a circular cylindrical configuration.

3. An extracting device according to claim 1, wherein said sliding track is an open channel having a rectangular cross section.

* * * * *